United States Patent
Manson et al.

(10) Patent No.: US 11,733,276 B2
(45) Date of Patent: Aug. 22, 2023

(54) POWER LINE SAG MONITORING DEVICE

(71) Applicant: Schweitzer Engineering Laboratories, Inc., Pullman, WA (US)

(72) Inventors: Scott M. Manson, Moscow, ID (US); Shankar V. Achanta, Pullman, WA (US); Gregory C. Zweigle, Pullman, WA (US); Richard M. Edge, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/811,482

(22) Filed: Jul. 8, 2022

(65) Prior Publication Data

US 2022/0344926 A1    Oct. 27, 2022

Related U.S. Application Data (62) Division of application No. 17/199,508, filed on Mar. 12, 2021, now Pat. No. 11,424,609, which is a division of application No. 16/248,359, filed on Jan. 15, 2019, now Pat. No. 10,978,863.

(51) Int. Cl.
| | |
|---|---|
| *G01R 31/08* | (2020.01) |
| *G01R 19/165* | (2006.01) |
| *H02H 7/26* | (2006.01) |
| *G01B 17/00* | (2006.01) |
| *G01R 19/25* | (2006.01) |
| *G01P 15/18* | (2013.01) |
| *H02H 1/00* | (2006.01) |
| *G01R 31/12* | (2020.01) |

(52) U.S. Cl.
CPC ......... *G01R 19/2513* (2013.01); *G01B 17/00* (2013.01); *G01P 15/18* (2013.01); *G01R 19/16571* (2013.01); *G01R 31/085* (2013.01); *G01R 31/1272* (2013.01); *H02H 1/0007* (2013.01); *H02H 1/0023* (2013.01); *H02H 1/0092* (2013.01); *H02H 7/26* (2013.01)

(58) Field of Classification Search
CPC ..... G01R 31/085; G01R 19/2513; H02H 7/26
See application file for complete search history.

(56) References Cited

U.S. PATENT DOCUMENTS

| | | | |
|---|---|---|---|
| 2016/0178681 A1* | 6/2016 | Lilien | H02J 13/00002 702/130 |
| 2017/0328945 A1* | 11/2017 | Achanta | H02H 3/033 |

\* cited by examiner

*Primary Examiner* — Jared Fureman
*Assistant Examiner* — Christopher J Clark
(74) *Attorney, Agent, or Firm* — Bradley W. Schield; Richard M. Edge (57) ABSTRACT

The present disclosure relates to systems and methods of sag in a power line. In an embodiment, a monitoring device may include a distance sensor and an operating parameter sensor. A processor of the monitoring device may acquire, via the distance sensor, a first distance measurement. The processor may acquire, via the operating parameter sensor, a first operating parameter measurement. The processor may provide an output signal indicating that the power line is sagging when a combination of the first distance measurement and the first operating parameter measurement exceed a first combined distance-operating parameter threshold.

5 Claims, 7 Drawing Sheets

POWER LINE SAG MONITORING DEVICE

RELATED APPLICATIONS

This application claims priority under 35 U.S.C. §§ 120 and 121 as a divisional application of U.S. patent application Ser. No. 17/199,508 filed on 12 Mar. 2021 naming Scott M. Manson, Shankar V. Achanta, Gregary C. Zweigle, and Richard M. Edge as inventors and titled "Power Line Sag Monitoring Device which claims priority under 35 U.S.C. §§ 120 and 121 as a divisional application of Ser. No. 16/248,359 filed on 15 Jan. 2019 naming Scott M. Manson, Shankar V. Achanta, Gregary C. Zweigle, and Richard M. Edge as inventors and titled "Power Line Sag Monitoring Device" each of which is incorporated herein by reference in its entirety.

TECHNICAL FIELD

The present disclosure relates generally to power systems and, more particularly, to a device that monitors power line sag.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Power lines are commonly used to deliver power from a power generator to one or more loads. Such power lines may include one or more conductors to conduct energy between the power generator and the loads and are often installed on overhead structures or buried underground. For example, a power lines may be suspended between overhead structures to prevent the power line from discharging power onto the ground, another power line, or another object. Ambient temperature, wind speed, humidity, and other environmental factors may affect the power line temperature. Further, the amount of energy delivered on the power line may also affect the power line temperature.

As the power line temperature increases, the power line may expand causing the power line to sag a certain amount towards the ground. Sag may refer to a distance to which the power line sinks towards the ground or other objects due to slack in the power line between overhead structures. Slack may refer to additional conductor length between overhead structures than if the conductor were taut (e.g., tightly coupled) between the overhead structures. As used herein, sagging may refer to a power line that has more slack between overhead structures than a desired (e.g., reference) amount of slack. The amount of sag may cause the power line to approach or to contact other objects, such as vegetation, which may lead to power losses or may violate local codes. Accordingly, there is a need for improved methods of determining the sag of a power line.

Systems and methods described below may monitor a power line by using a combination of sensors to more reliably determine sag and other properties of the power line than using data from a single sensor. A monitoring device may monitor various operating parameters of the power line, such as distance from the power line to the ground, ambient temperature of the surrounding environment of the power line, and current of the power line. For example, the monitoring device may provide an alarm when a combination of two or more measurements from operating parameters exceed a combined threshold that is based on each of the two or more operating parameters. For instance, the monitoring device may provide an output signal indicating that the power line is sagging when a combination of distance and temperature measurements exceed a threshold. In some embodiments, the monitoring device may determine a change in one or more operating parameters over time, such as change distance over time, change in temperature over time, or change in current over time, to monitor the physical properties of the power line. Moreover, in certain embodiments, the monitoring device may monitor both line sag and discharge events on the power line. In such embodiments, the monitoring device may measure tilt of the power line to estimate the sag. By monitoring angular changes in tilt, the monitoring device may be positioned on the power line closer to a structure that supports the power line to allow the monitoring device to more reliably detect discharge events that occur at or proximate to the structure. The monitoring device may provide an alarm when the sag on the power line exceeds a threshold.

Figure 1:
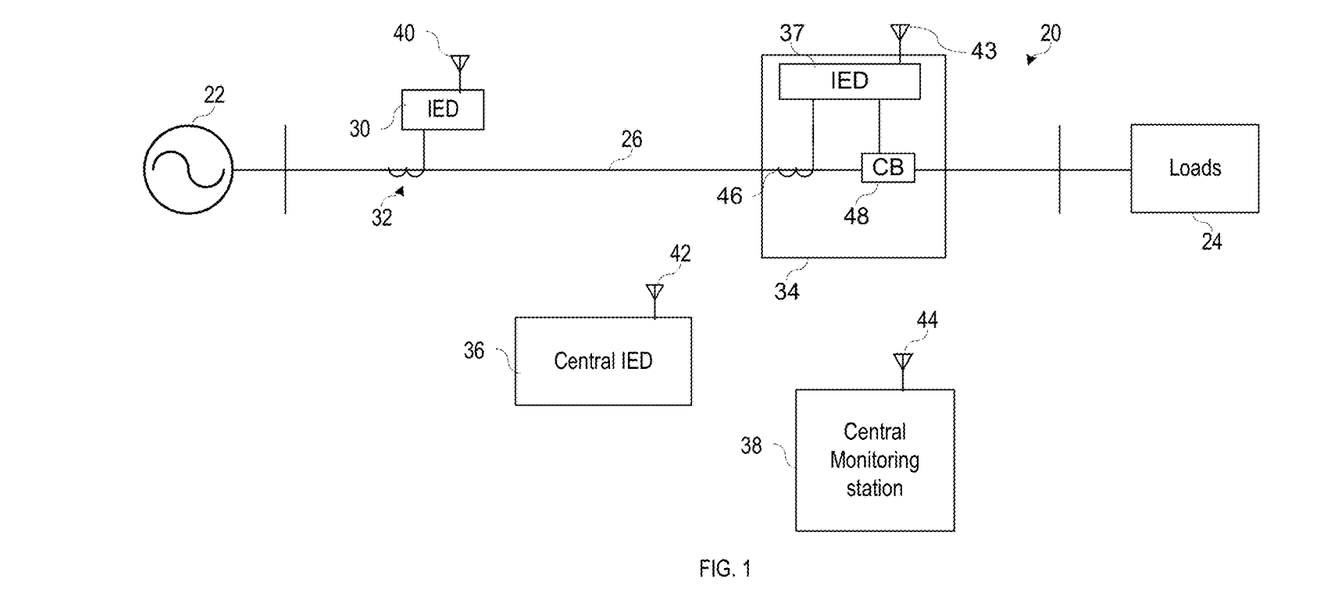
FIG. 1 is a one-line diagram of a power system that includes a power line with a monitoring system for monitoring power line sag, in accordance with an embodiment.

FIG. 1 illustrates a one-line diagram of a power delivery system 20 having a power generator 22 electrically coupled to one or more loads 24 via a power line 26. The power delivery system 20 may be, for example, a three-phase power delivery system. The power line 26 may include a monitoring device 30, such as a line mounted, line powered (LMLP) device. The monitoring device 30 may monitor the power line 26 via sensors 32 to detect various operating parameters of the power line 26, such as ambient temperature, wind speed, humidity, current, voltage, distance to the ground, acceleration, sound, light, and the like. In the illustrated embodiment, the monitoring device 30 may determine sag of the power line 26 based on the one or more operating parameters of the power line 26 detected via the sensors 32. The monitoring device 30 may include a transceiver 40 that communicates with one or more other intelligent electronic devices (IEDs) (e.g., central IED 36, substation IED 37 at a substation 34, etc.) and/or a central monitoring station 38 via the transceivers 42, 43, and 44.

The monitoring device 30 may communicate data over a wide-area communications network of electronic devices or may communicate directly with the IEDs 36 and 37 and/or the central monitoring station 38. In the illustrated embodiment, the substation relay 37 may include a current transformer 46 and a circuit breaker 48 to monitor and control electrical characteristics of the power line 26. According to various embodiments, central monitoring system 38 may comprise one or more of a variety of types of systems. For example, central monitoring system 38 may include a supervisory control and data acquisition (SCADA) system and/or a wide area control and situational awareness (WACSA) system.

A communication network between the monitoring device 30, the IEDs 36 and 37, and the central monitoring station 38 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be used in order to perform a variety of tasks that pertain to network communications and/or to operation of equipment within the power delivery system 20.

Figure 2:
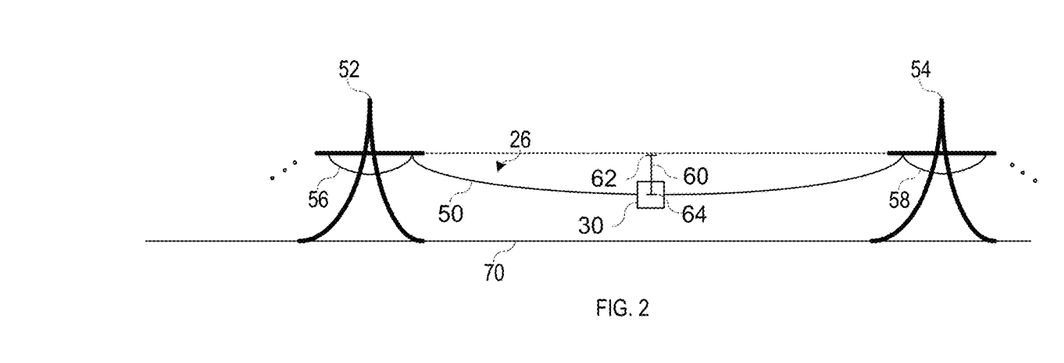
FIG. 2 is a side view of the power line of FIG. 1, in accordance with an embodiment.

FIG. 2 is a side view of the power line 26, in accordance with an embodiment. In the illustrated embodiment, a segment 50 of the power line 26 is suspended overhead between a first structure 52 and a second structure 54. The power line 26 may include jumpers 56 and 58 to electrically couple the segment 50 to one or more other segments of the power line 26. In some embodiments, the monitoring device 30 may monitor, for example, one or more of the phases of multi-phase power system (e.g., two phase, three phase, six phase). In the illustrated embodiment, the sag 60 may refer to the difference between the height 62 at which the segment 50 of the power line 26 is suspended and the height 64 at which the segment 50 sinks towards the earth. The monitoring device 30 may be positioned at a midpoint of the segment 50 of the power line 26 where the sag of the power line 26 is likely to be the largest. In some embodiments, sag may be estimated based on angular changes, referred to as tilt, in the power line 26 to allow the monitoring device 30 to be positioned toward an end of the segment 50 of the power line 26.

Conventional sag detection systems may determine a distance based on a single measurement. For example, some sag detection systems may measure the distance to the nearest object. However, these systems may be unreliable due to using a single measurement to analyze sag. For example, the nearest object may be an animal which may cause a change in the distance measurement, thereby causing sag to be overestimated. Further, because distance is likely to be the largest at the midpoint of the power line 26, some systems may be positioned at the midpoint to detect the shortest distance. Because these systems are positioned at the midpoint, it may be more difficult to determine other desirable information regarding the power line 26.

As explained below, the monitoring device 30 may include various sensors 32 to monitor various operating parameters of the power line, such as distance from the power line 26 to an object or ground, ambient temperature of air surrounding the power line 26, current of the power line 26, wind speed near the power line 26, movement of the power line 26, or any combination thereof. As heat of the power line 26 increases, the sag of the power line 26 may increase. In some embodiments, by using a combination of measurements (e.g., a combination of distance and current, a combination of distance and ambient temperature, etc.), alarms regarding sag may be more reliably provided than when using a single measurement. Additionally and/or alternatively, by measuring changes to such operating parameters over time, the resulting alarms may be more reliable than alarms resulting from a single measurement compared to a threshold. Moreover, in some embodiments, the monitoring device 30 may be positioned at a location other than the midpoint. For example, angular tilt of the line may be used to determine the sag of the power line 26. By monitoring the power line 26 at a location closer to a structure, the monitoring device 30 may more reliably determine, for example, whether a discharge event has occurred at or near the structure.

Figure 3:
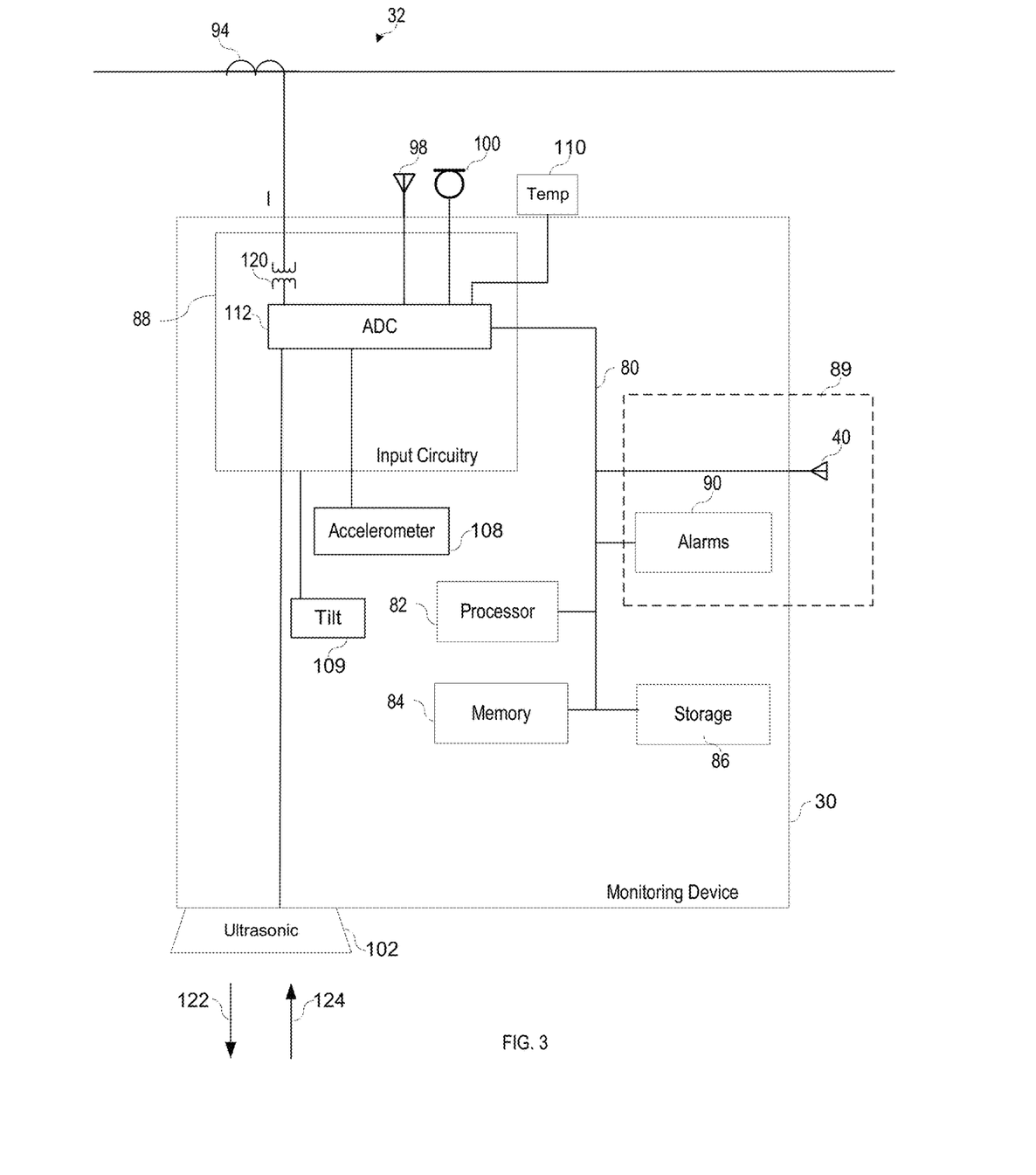
FIG. 3 is a block diagram of the monitoring system of FIG. 1, in accordance with an embodiment.

FIG. 3 is a block diagram of the monitoring device 30 used to determine sag of the power line 26, in accordance with an embodiment. In the illustrated embodiment, the monitoring device 30 is operably coupled to sensors 32. As used herein, the monitoring device 30 may refer to any microprocessor-based device that monitors and/or protects monitored equipment within the electric power delivery system 20, such as an IED. Such devices may include, for example, programmable logic controllers (PLCs), programmable automation controllers, input and output modules, digital relays, and the like. The term IED may be used to describe an individual IED or a system comprising multiple IEDs.

In the illustrated embodiment, the monitoring device 30 includes a bus 80 operably coupling a processor 82 or processing unit(s) to a memory 84, a computer-readable storage medium 86, input circuitry 88, and communication circuitry 89. The computer-readable storage medium 86 may include or interface with software, hardware, or firmware modules for implementing various portions of the systems and methods described herein. The tangible, non-transitory computer-readable storage medium 86 may be the repository of one or more modules and/or executable instructions configured to implement any of the processes described herein.

The processor 82 may be configured to process inputs received via the input circuitry 88. In the monitoring device of FIG. 3, the processor(s) 82 may be operably coupled with the memory 84 and the nonvolatile storage 86 to perform various algorithms described herein. Such programs or instructions executed by the processor(s) 82 may be stored in any suitable article of manufacture that includes one or more tangible, computer-readable media at least collectively storing the instructions or routines, such as the memory 84 and/or the nonvolatile storage 86. The memory 84 and the nonvolatile storage 86 may include suitable articles of manufacture for storing data and executable instructions, such as random-access memory, read-only memory, rewritable flash memory, hard drives, and optical discs. These computer program instructions may be provided to a processor of a general-purpose computer, special purpose computer, or other programmable data processing apparatus to produce a machine, such that the instructions, which executed via the processor of the computer or other programmable data processing apparatus, causes the processor to implement the operations described with respect to FIGS. 4-8. In some embodiments, the processor 82 and/or the computer-readable storage medium 86 and the modules therein may be embodied as a microprocessor, a general purpose integrated circuit, a Field Programmable Gate Array ("FPGA"), one or more Application Specific Integrated Circuits ("ASICs"), and/or other programmable logic devices.

While the monitoring device 30 is used to perform the processing described herein, some or all of the processes described herein may be performed at the one or more other IEDs (e.g., the central IED 36 and/or the substation IED 37) and/or the central monitoring station 38. For example, the IED 30 may communicate the data (e.g., electrical data, radio data, ultrasonic data, temperature data, acceleration data, tilt data, etc.) to the substation IED 37 to cause the substation IED 37 to perform the processes described herein and to control operation of the circuitry breaker 48 based on the processes. For instance, if the substation IED 37 determines that an event (e.g., acceleration event, sagging event, etc.) has occurred based on measurements from the IED 30, the substation IED 37 may electrically disconnect loads 24 via the circuit breaker 48.

In the illustrated embodiment, the input circuitry 88 receives electrical signal(s) from various operating parameter sensor(s), such as an electrical sensor 32, a radio frequency (RF) antenna 98, an acoustic sensor 100, an ultrasonic sensor 102, a temperature sensor 110, accelerometer, tilt sensor, current sensor, and the like. For example, the input circuitry 88 may receive electrical signal(s) from the electrical sensor 32 to detect one or more electrical characteristics of the power being delivered on the power line 26. For instance, the input circuitry 88 may receive a current signal from the current transformer 94. The input circuitry 88 may include a potential transformer 120 that transforms the current signal to a level that may be sampled.

Further, the input circuitry 88 may receive an RF signal from the RF antenna 98 and an audio signal from an acoustic sensor 100. The RF antenna 98 may be any suitable antenna to detect radio wave(s). The RF antenna 98 may convert energy from the detected radio wave into a radio signal to allow the monitoring device 30 to monitor the radio waves emitted due to electromagnetic waves caused by discharge events. The RF antenna 98 may be operatively coupled to any suitable input circuitry 88, such as encode/decode circuitry, to enable the processor 82 to use the received radio signals.

Similarly, the acoustic sensor 100 may be any suitable sensor that detects sound wave(s), such as a microphone, a pressure transducer, or the like. The acoustic sensor 100 may convert energy from the sound waves into an audio signal to monitor the sound waves received by the acoustic sensor 100. The acoustic sensor 100 may be operatively coupled to any suitable input circuitry 88, such as capacitors, amplifiers, or the like, to allow the processor 82 to use the received audio signals.

In the illustrated embodiment, the input circuitry 88 receives a signal indicative of a distance measurement from a distance sensor, such as an ultrasonic sensor 102, a light detection and ranging (LIDAR) sensor, radio detection and ranging (RADAR), or the like. For example, the ultrasonic sensor 102 may direct ultrasonic sound waves 122 towards ground. Some or all of the ultrasonic sound waves 122 may be reflected 124 back to the ultrasonic sensor 102. A distance to a nearest object or ground may be measured based on the difference in time between when the ultrasonic sound wave 122 is transmitted and when the reflected waves 124 are received. The ultrasonic sensor 102 may provide distance signal(s) indicating distance measurements to the ground or the nearest object based on a difference in time between transmitting the ultrasonic sound wave 122 receiving the reflected wave 124.

Additionally and/or alternatively, the input circuitry 88 may receive a signal indicative of an acceleration measurement of the monitoring device 30 from an accelerometer 108. The accelerometer 108 may be any suitable accelerometer that detects acceleration of the power line 26 and is further described in conjunction with FIG. 8.

The input circuitry 88 may receive, from the temperature sensor 110, a temperature signal indicative of ambient temperature of air surrounding the power line 26. In the illustrated embodiment, the temperature sensor 110 may provide an analog signal to the A/D converter(s) 112 indicative of the ambient temperature.

A/D converter(s) 112 may sample each of the signals from the potential transformers 120 and 122, the RF antenna 98, the acoustic sensor 100, the ultrasonic sensor 102, and/or the temperature sensor 110. The A/D converter(s) 112 may produce digitized analog signals representative of measured current, measured voltage, measured sound waves, measured radio waves, measured acceleration, and measured temperature. The measurements may be in a digital format or other format. In certain embodiments, the input circuitry 88 may be used to monitor current signals associated with a portion of an electric power delivery system.

The A/D converter 112 may be connected to the processor 82 by way of the bus 80, through which digitized representations of current signal, the voltage signal, the RF signal, the audio signal, the distance signal, and the acceleration signal may be transmitted to the processor 82. Depending on the implementation, the any of the sensors may provide digital and/or analog signals to the input circuitry 88. In some embodiments, digital signals from the sensors may be provided directly to the bus 80. As described above, the processor 82 may be used to monitor and protect portions of the electric power delivery system 20, and issue control instructions in response to the same (e.g., instructions implementing protective actions).

In the illustrated embodiment, the input circuitry 88 may provide digital signals representative of the current measurements, the RF measurements, the audio measurements, the temperature measurements, the distance measurements, and the acceleration measurements, to the processor 82 via the bus 80. The processor 82 may receive the digital signals representative of the current signal from the current transformer 94, the radio signal from the antenna 98, the audio signal from the acoustic sensor 100, the distance signal from the ultrasonic sensor 102, the acceleration signal from the accelerometer 108, and the tilt signal from the tilt sensor 109. The processor 82 may determine sag of the power line 26 based on the digital representations of one or more of the signals. For example, the processor 82 may determine sag based on the current measurements, the distance measurements, the temperature measurements, and/or tilt measurements, among others.

The processor 82 may provide an output signal indicating the sag via communication circuitry 89 of the monitoring device 30, such as the transceiver 40 and/or one or more alarms 90. For example, the processor 82 may send the output signal to the IED 36 and/or the central monitoring station 38 to allow the central monitoring station 38 to display an amount of sag on a display at the central monitoring station 38. This may allow an operator to further inspect the power line 26. In some embodiments, the processor 82 may send an output signal indicating the sag of the power line 26 to the IED 36 and/or the central monitoring station 38 to cause the IED 36 or another IED to perform a protective action on the power delivery system 20. For example, the processor 82 may send the output signal indicating that the power line 26 is sagging to cause the IED to open a circuit breaker to disconnect the power line 26 from the power delivery system 20. While two antennas 40 and 98 are shown, this is meant to be illustrative and, in some embodiments, the same antenna may be used for communication as well as monitoring the power line 26 for radio waves.

In some embodiments, the communication circuitry 89 may include one or more alarms 90, such as light emitting diodes (LEDs), displays, audible sounds, or the like, to notify an operator of the sag of the power line 26. For example, the processor 82 may send an output signal to control operation of one or more of the alarms 90 to provide an indication, for example, that sag has increased beyond a desired amount if one or more thresholds are exceeded.

Figure 4:
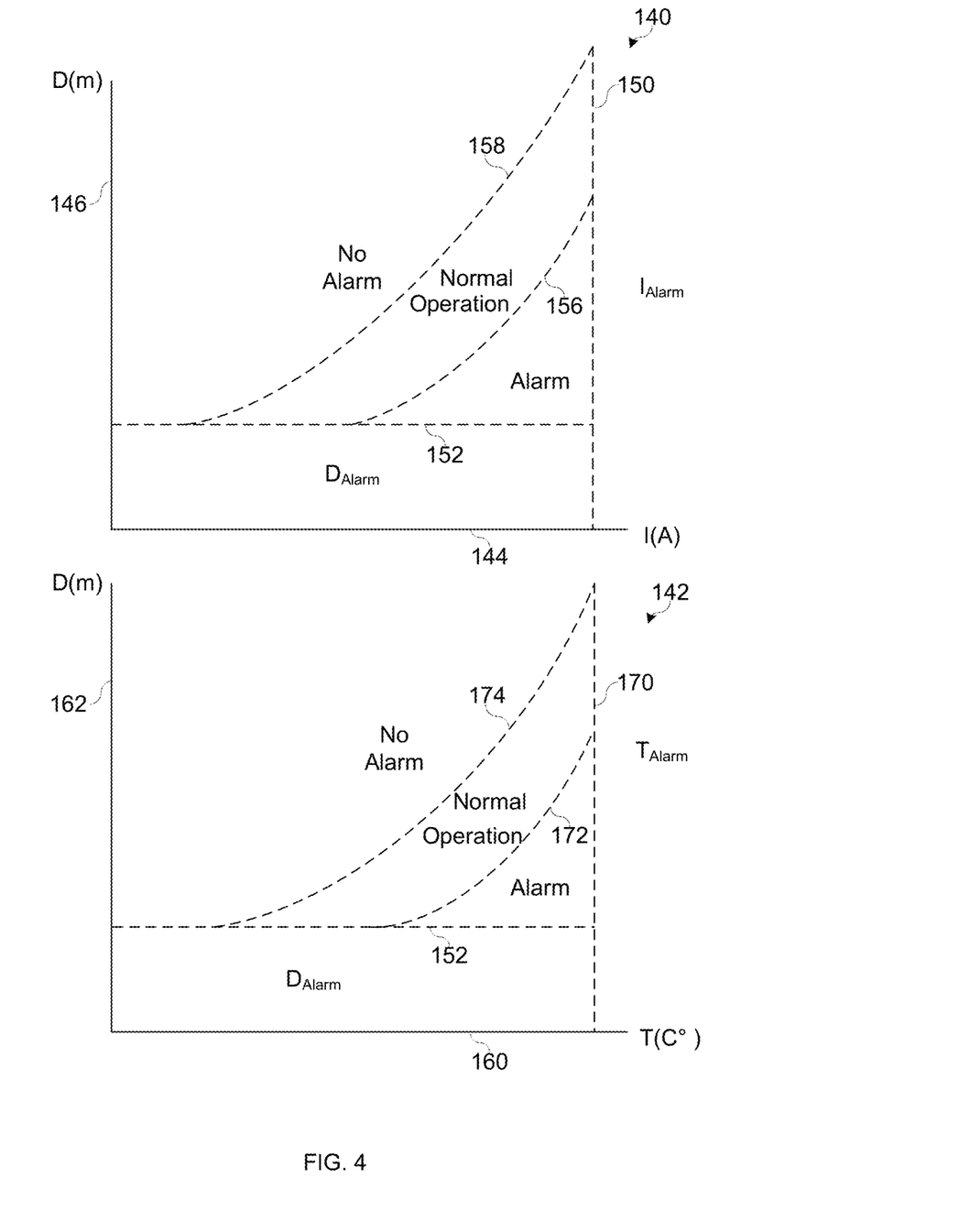
FIG. 4 is a set of plots of thresholds that may be used in processing the data received by the monitoring system of FIG. 1, in accordance with an embodiment.

FIG. 4 is a set of plots 140 and 142 illustrative of a combination of sensor data regarding sag of the power line 26. While the plots 140 and 142 are depicted visually for explanatory purposes, in some embodiments, the processor 82 may execute instructions stored on the memory and perform the operations described herein without generating a visual plot. Note that, while current, distance, and temperature are used as examples of operating parameters being monitored in combination with one another, any suitable combination of two or more operating parameters may be used. The thresholds described below may depend upon the implementation. In some embodiments, the thresholds may be user inputs received, via the communication circuitry 89 or other input structures, and stored in the memory 84.

The plot 140 illustrates an operating parameter, such as current (I(A)), on a first axis 144, with distance to the ground or nearest object (D(m)), on a second axis 146. The processor 82 may determine, independent of distance, whether the current measurements exceed a current threshold associated with an overcurrent condition of the power line 26. If the current threshold 150 is exceeded, the processor 82 may provide an output signal indicating that current on the power line 26 is exceeding the overcurrent condition. Similarly, the processor 82 may determine, independent of current, whether the distance of the power line 26 to the ground or nearest object falls below a distance threshold 152. If the distance falls below the distance threshold 152, an output signal may be provided indicating that the power line is sagging. For example, the distance threshold 152 may be a threshold associated with the height 64 of the power line 26.

Further, the processor 82 may determine whether a combination of the current measurements and the distance measurements exceeds a first combined current-distance threshold 156 (e.g., falls outside of a normal operation region) and provide the output signal indicating that the first combined threshold is exceeded. That is, the first combined current-distance threshold 156 may be a threshold that indicates that a greater current than desired is being provided via the power line 26 in combination while the power line 26 sinking toward the ground more than desired. The processor 82 may provide an output signal indicating that that the first combined current-distance threshold is exceeded (e.g., operating outside of the normal operation region). For example, the processor 82 may send the output signal to an IED to cause the IED to open a circuit breaker to reduce current being delivered on the power line 26 to limit the power being delivered on the power line 26 to be within the normal operating region. As such, the processor 82 may send the output signal to cause an IED to limit the combination of distance and current of the power line 26 to not exceed desired levels.

In some embodiments, the processor 82 may provide an output signal indicating that additional current and/or distance is available on the power line 26 when the combination of current and distance is below a second combined current-distance threshold 158. That is, if the combination of current and distance falls below the second threshold current-distance threshold 158, the power line 26 may be allowed to sag more by increasing energy transferred on the power line 26 without causing excess sag (e.g., operating in the normal operating region). As such, the processor 82 may provide an output signal indicating that additional bandwidth is available on the power line 26 to allow for additional loads to be powered by the electrical power delivery system 20.

The plot 142 illustrates another operating parameter, such as temperature, on a first axis 160 and distance on an ordinate axis 162. The processor 82 may determine, independent of distance, whether ambient temperature measurements exceed a temperature threshold 170. If the temperature threshold 170 is exceeded, an output signal may be provided indicating that the power line 26 has exceeded an overtemperature threshold. Similarly, if the distance from the monitoring device 30 to the ground or nearest object falls below the distance threshold 152, an output signal may be provided independent of the temperature, as described above.

The processor 82 may determine whether a combination of temperature and distance exceeds a first combined temperature-distance threshold 172. In the illustrated embodiment, the processor 82 provides an output signal indicating that the temperature and distance of the power line exceeds the first combined temperature-distance threshold 172 (e.g., operates outside of a desired normal operation region). For example, the processor 82 may send the output signal to an IED to cause the IED to open a circuit breaker to reduce current being delivered on the power line 26 to reduce the ambient temperatures surrounding the power line to cause the power line to operate within the normal operating region. As such, the processor 82 may send the output signal to cause an IED to limit the combination of distance and temperature of the power line 26 to not exceed desired levels.

If the combination of temperature and distance is below a second combined temperature-distance threshold 174, additional energy may be transferred on the power line 26 without causing excess sag. As such, the processor 82 may provide an output signal indicating that additional bandwidth is available on the power line 26 when the temperature and distance fall below the combined temperature-distance threshold 174. Additionally and/or alternatively to the combined monitoring of various operating parameters, the monitoring device 30 may monitor changes in operating parameters over time.

Figure 5:
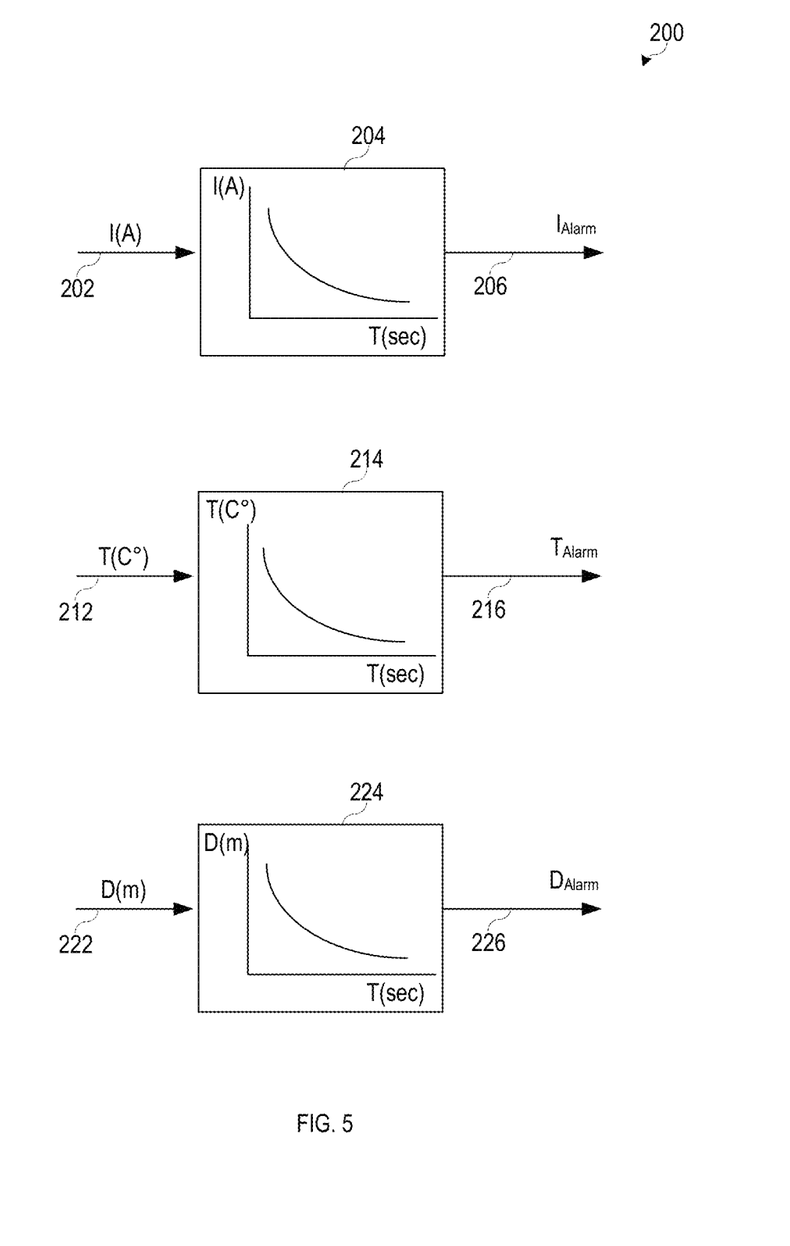
FIG. 5 is a logic diagram of processes performed by the monitoring system of FIG. 1, in accordance with an embodiment.

FIG. 5 is a logic diagram of a process performed by the monitoring device 30 to monitor changes in operating parameters, such as current, temperature, and/or distance, over time. One or more operating parameters may be compared to operating parameter over-time thresholds to determine whether a condition is persisting on a power line 26.

By monitoring the operating parameters over time, conditions that cause increased wear and tear on the power line 26 may be limited which may not be detected if the power line 26 were monitoring with other methods (e.g., current compared to over current thresholds for fault detection).

The processor 82 may receive the digital representation of current measurements 202 of the power line 26. The processor 82 may determine whether the current measurements from a first time to a second time persist to exceed a current-over-time threshold. The first time and second time may be over various periods of time (e.g., milliseconds, seconds, minutes, hours, etc.) to prevent heating of the power line 26 from exceeding the physical properties that the power line 26 was designed to withstand. The processor 82 may provide an output signal 206 indicating the overcurrent event if the current on the power line 26 has persisted over a period of time to be greater than the desired amount. By monitoring current over time, as described with FIG. 4, the processor 82 may more reliably detect greater current being delivered on the power line 26 than desired amounts and provide output signals of such events. As such, the monitoring device 30 may notify operators of such events to allow for reduced annealing caused by overheating of the power line 26. By protecting the power line 26 from annealing, the conductors of the power line 26 may maintain the desired strength and last for a greater duration than in systems that monitor current without monitoring how long such currents persist.

Similarly, the processor 82 may receive the digital representation of temperature measurements 212 indicative of ambient temperatures of the power line 26. The processor 82 may compare the temperature over time to one or more temperature-over-time thresholds. If ambient temperatures persist over time 214 to exceeds the temperature-over-time threshold, the processor 82 may provide an output signal 216 indicative of the temperature-over-time event. Similar to the above example, by monitoring ambient temperatures of the power line 26 over time, the processor 82 may more reliably detect greater amounts of heat surrounding the power line 26 that persist which may cause annealing. By protecting the power line 26 from such temperature-over-time events, the conductors of the power line 26 may maintain the desired strength and last for a greater duration than in systems that monitor ambient temperatures without monitoring how long such temperatures persist.

Likewise, the processor 82 may receive the digital representation of distance measurements 222 indicative of the distance from the ultrasonic sensor 102 to the ground or nearest object. The processor 82 may compare distance measurements over time to a distance-over-time threshold 154. If the distance over time 214 persists to exceeds a distance-over-time threshold, the processor 82 may provide the output signal 226 indicating that the power line 26 is sagging. By monitoring the distance over time, short variations in the distance, for example, caused by moving objects, may be avoided to enable more reliable monitoring of the sag of the power line 26. Further, at OR 228, the processor 82 may provide an output signal if any combination of alarms indicates that an over-time threshold has been exceeded.

In some embodiments, the change in distance of the power line 26 may be monitored via an accelerometer. That is, the processor 82 may determine the acceleration ($d^2D/dt^2$) of the power line. The processor 82 may further determine wind speed, ice shedding, or both, based on acceleration of the monitoring device 30 detected by the accelerometer.

Figure 6:
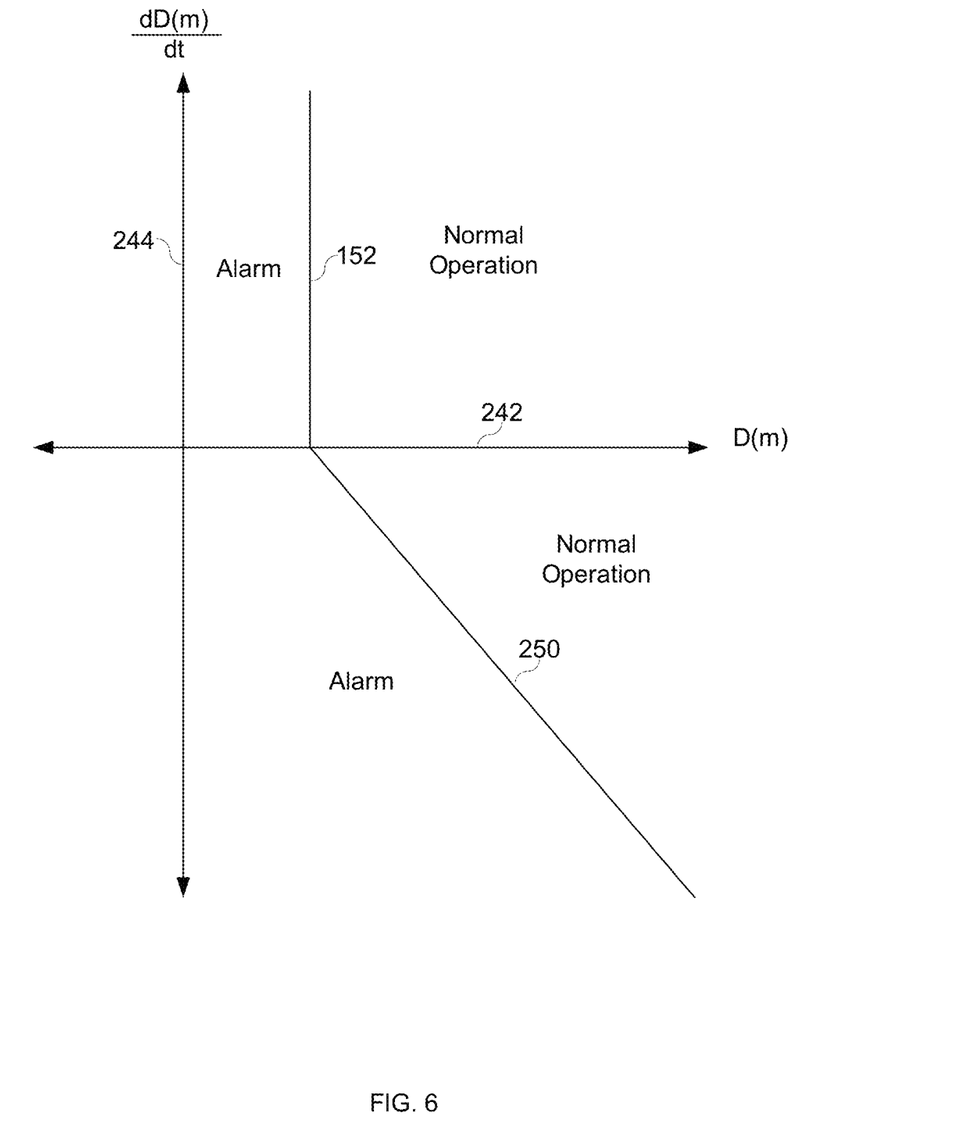
FIG. 6 is a plot of thresholds that may be used in processing the data received by the monitoring system of FIG. 1, in accordance with an embodiment.

FIG. 6 is a plot of changes in distance over time (dD/dt) with respect to distance. Note that, while changes in distance over time with respect to distance are used in the illustrated embodiment, similar analysis may be performed using changes in temperatures over time with respect to temperature, changes in current over time with respect to current, or any other suitable operating parameter of the power line 26. The plot 240 includes distance from the ground or nearest object in meters on a first axis 242 and a change in distance with respect to time on a second axis 244. As mentioned above, the processor 82 may determine whether the distance exceeds distance threshold 152. Further, the processor 82 may determine whether the distance and the distance over time dD/dt exceeds a combined distance dD/dt threshold 250. If the measured distance and the measured distance over time exceeds the combined threshold 250, the processor 82 may provide the output signal indicating that the power line 26 is sagging or likely to begin sagging.

The monitoring device 30 may be used to monitor a variety of operating parameters associated with the power line 26. For example, the monitoring device 30 may be used to monitor and detect faults on the power line 26 based on current measurements of the power line 26. As another example, the monitoring device 30 may be used to detect discharge events associated with operation of the power line 26. Discharge events may refer to partial discharge and/or corona discharge of the power line 26. For example, due to aging, insulation between the structure 52 and the power line 26 may degrade. Due to this degradation, energy may be discharged from the power line 26 to ground or another conductor through the degraded insulation, resulting in power losses in the power delivery system 20. Sound waves, RF waves, and/or traveling waves may be emitted due to these discharge events.

Figure 7:
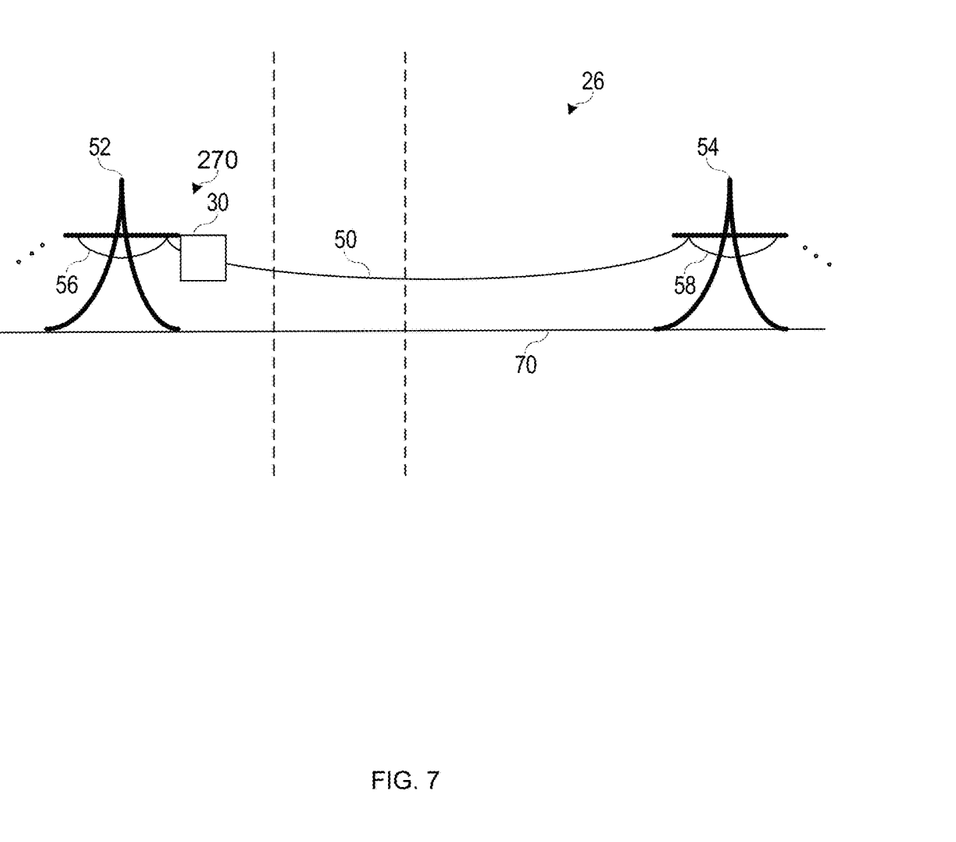
FIG. 7 is another side view of the power line of FIG. 1, in accordance with an embodiment.

FIG. 7 is another example of the monitoring device 30 that may be used to determine sag and to detect discharge events of the power line 26. The monitoring device 30 may be positioned on the power line 26 at a location other than a midpoint of the power line. That is, the monitoring device 30 may be mounted to the power line 26 to a position proximate to a structure. In some embodiments, the monitoring device 30 may be positioned closer in proximity to the first structure 52 of the power line 26 than to a midpoint of the span between the first structure 52 and the second structure 54 to allow the monitoring device 30 to more accurately detect discharge events while determining sag in the power line 26. For instance, the monitoring device 30 may be positioned proximate to the first structure 52 to allow the monitoring device 30 to detect sound waves, RF waves, and/or traveling waves emitted from a discharge event at the insulation of the first structure 52. That is, sensor circuitry, such as the current transformer 94, the antenna 98 and the microphone 100, may be coupled or positioned proximate to the power line 26 such that the sensor circuitry is closer to the first structure 52 than a midpoint between the first structure 52 and the second structure 54. In some embodiments, the monitoring device 30 may be mounted on the first structure 52 or adjacent to the first structure 52.

Because the monitoring device 30 is positioned at a location other than the midpoint, sag of the power line 26 may be inferred without direct measurement of the distance. The monitoring device 30 may determine the sag of the power line 26 at the midpoint by inferring from tilt angles received from the tilt sensor 109 positioned proximate to the structure 52. For example, the processor 82 may infer the sag via a look-up table of tilt angles to approximate the sag at the midpoint.

By positioning the monitoring device 30 in a position other than the midpoint between the first structure 52 and the second structure 54, the monitoring device 30 may provide additional information regarding discharge events. For example, the processor 82 may provide a first output signal when the tilt angle measurements indicate that the power line is sagging based on the inferred sag from tilting of the power line 26, and the processor 82 may provide a second output signal when the one or more operating parameter measurements, such as the measurements of the RF signal, the audio signal, or the like, indicate that a discharge event has occurred. The first output signal and/or the second output signal may be received at the monitoring station to be displayed on a display at the monitoring station to notify an operator if the power line is sagging and/or a discharge event has occurred. In some embodiments, the monitoring device 30 may notify the monitoring station of the type of indication (e.g., a sag indication, current-over-time indication, etc.) as well as provide the corresponding measurements.

In some embodiments, wind speed, and/or ice shedding, among others, may be determined by inferring, from acceleration measurements, aspects of the power line 26. The monitoring device 30 may detect these events of the power line 26 based on the acceleration of the accelerometer of the monitoring device 30.

Figure 8:
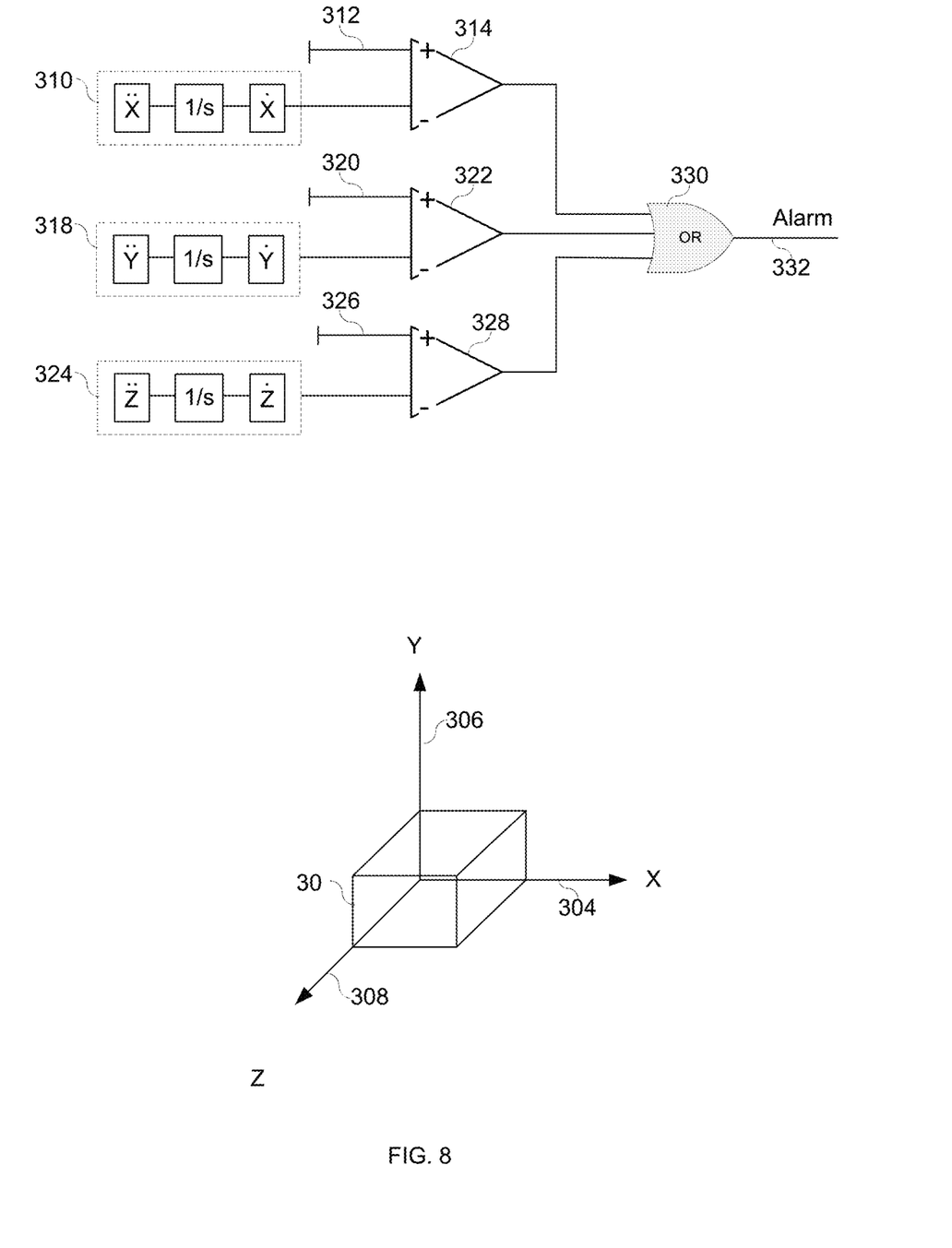
FIG. 8 is a logic diagram of a process performed by the monitoring system of FIG. 1, in accordance with an embodiment.

FIG. 8 is a logic diagram of a process 300 performed by the processor 82 to detect an acceleration event of the power line. Further, FIG. 8 includes a 3D coordinate system 302 that illustrates an x-axis 304, a y-axis 306, and a z axis 308 that may be used in conjunction with the flow diagram. The processor 82 may determine whether a combination of acceleration, speed, and distance of movement in the x direction (block 310) exceed an x-direction threshold 312 via comparator 314. Further, the processor 82 may determine whether a combination of acceleration, speed, and distance of movement in they direction (block 318) exceed a y-direction threshold 320 via comparator 322. Likewise, the processor 82 may determine whether a combination of acceleration, speed, and distance of movement in the z-direction (block 324) exceed a z-direction threshold 326 at comparator 328. Based on whether any of the thresholds are exceeded, the processor 82 may provide an output signal indicating the movement and/or location of the power line 26.

To detect an acceleration event of the power line, the processor 82 may determine whether any combination of movement of the monitoring device 30 exceeds the x-direction threshold 312, y-direction threshold 320, and z-direction threshold 326 at OR 330. The processor 82 may provide an output signal indicating that the power line 26 is moving greater than at least one of the x-direction threshold 312, the y-direction threshold 320, and the z-direction threshold 326. For example, the processor 82 may send the output signal to a display of the monitoring device 30 to indicate that the acceleration event has occurred. In other embodiments, the processor 82 may communicate the output signal to another electronic device via the communication circuitry 89 to allow an operator to assess the acceleration event.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A non-transitory, computer readable medium comprising instructions, that when executed by a processor, cause the processor to perform operations, comprising:
   receive operating parameter measurements of a first operating parameter of a power line over a period of time;
   determine a power line sag based on a comparison of the operating parameter measurements to an operating parameter over-time threshold;
   provide an output signal indicating that the power line sag exceeds a threshold when the operating parameter measurements have exceeded the operating parameter over-time threshold for the entirety of the period of time.

2. The non-transitory, computer readable medium of claim 1, comprising instructions that, when executed by the processor, cause the processor to:
   receive first current measurements of the power line over the period of time; and
   determine whether the current measurements on the power line exceed a current-over-time threshold over the period of time.

3. The non-transitory, computer readable medium of claim 1, comprising instructions that, when executed by the processor, cause the processor to:
   acquire, via an ultrasonic sensor, a first distance measurement between the power line and the ground or nearest object; and
   provide the output signal when a combination of the first distance measurement and one or more of the operating parameter measurements exceed a first combined distance-operating parameter threshold.

4. The non-transitory, computer readable medium of claim 3, comprising instructions that, when executed by the processor, cause the processor to:
   compare a combination of the first distance measurement and a change in the distance over the period of time to a distance-dD/dt threshold; and
   provide the output signal when the combination of the first distance measurement and the change in the distance exceeds the distance-dD/dt threshold.

5. The non-transitory, computer readable medium of claim 4, wherein the distance-dD/dt threshold comprises a linear relationship between distance and change in distance over time.

* * * * *